(12) United States Patent
Wilmot et al.

(10) Patent No.: US 9,262,299 B1
(45) Date of Patent: *Feb. 16, 2016

(54) SIMULATION OBSERVABILITY AND CONTROL OF ALL HARDWARE AND SOFTWARE COMPONENTS OF A VIRTUAL PLATFORM MODEL OF AN ELECTRONICS SYSTEM (71) Applicant: Cadence Design Systems, Inc., San Jose, CA (US)

(72) Inventors: Andrew Wilmot, Carlisle, MA (US); William W. LaRue, Jr., Leawood, KS (US); Neeti Bhatnagar, San Jose, CA (US); Dave Von Bank, Rogers, MN (US); Joshua Levine, Redwood City, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 222 days.

This patent is subject to a terminal disclaimer.

(21) Appl. No.: 13/907,566

(22) Filed: May 31, 2013

(51) Int. Cl.
*G06F 9/44* (2006.01)
*G06F 11/36* (2006.01)

(52) U.S. Cl.
CPC .......... *G06F 11/362* (2013.01); *G06F 11/3668* (2013.01)

(58) Field of Classification Search
None
See application file for complete search history.

(56) References Cited

U.S. PATENT DOCUMENTS

| | | | |
|---|---|---|---|
| 5,809,283 A | 9/1998 | Vaidyanathan et al. | |
| 7,356,679 B1 * | 4/2008 | Le | G06F 17/30067 707/E17.01 |
| 7,478,388 B1 * | 1/2009 | Chen | G06F 9/45554 718/1 |
| 7,529,897 B1 * | 5/2009 | Waldspurger | G06F 11/1438 711/161 |
| 8,473,269 B1 * | 6/2013 | Ou et al. | 703/14 |
| 8,572,606 B1 * | 10/2013 | Agesen | G06F 11/004 718/1 |
| 8,683,444 B1 * | 3/2014 | Spycher et al. | 717/125 |
| 2002/0059054 A1 * | 5/2002 | Bade et al. | 703/20 |
| 2008/0319730 A1 * | 12/2008 | Clark et al. | 703/19 |
| 2009/0307299 A1 * | 12/2009 | Malesich et al. | 709/202 |
| 2012/0151267 A1 | 6/2012 | Bhattacharjee et al. | |
| 2012/0179447 A1 * | 7/2012 | Lin et al. | 703/22 |
| 2013/0007720 A1 * | 1/2013 | Cai | G06F 11/3664 717/130 |
| 2013/0111266 A1 * | 5/2013 | Tosaka | 714/28 |

* cited by examiner

*Primary Examiner* — Insun Kang
(74) *Attorney, Agent, or Firm* — Kenyon & Kenyon LLP (57) ABSTRACT

Aspects of the present invention provide a system and method for a user of an event-driven simulator to specify complex breakpoint conditions and actions which allow both hardware and software states to be accessed. In a virtual platform modeling hardware components, bare-metal software programs, and high-level software applications or processes, a global identifier may be used to unambiguously identify each element, object, and subcomponent of the modeled system. The unambiguous global identifier may include an instance name and a hierarchical path name. A state of a specific element, object, or modeled component may trigger a breakpoint or be utilized or set as part of a breakpoint condition.

20 Claims, 8 Drawing Sheets

SIMULATION OBSERVABILITY AND CONTROL OF ALL HARDWARE AND SOFTWARE COMPONENTS OF A VIRTUAL PLATFORM MODEL OF AN ELECTRONICS SYSTEM

BACKGROUND

Aspects of the present invention relate generally to the field of system development and test, and more specifically to event-driven simulation of electronics.

Simulation of hardware components can be modeled at various levels of abstraction using event-driven simulation. Processor models implementing Instruction Set Simulators (ISS) in combination with hardware simulators can be used to simulate cross-compiled embedded software, for example, an operating system (OS). A collection of hardware models running such embedded software is known as a Virtual Platform (VP). However, when developing VPs and the corresponding actual systems which they model, issues with incorrect or unexpected interactions between the hardware and software components of the system can occur. Debugging these issues is often complicated by VP environment limitations, which typically restrict observability and controllability of the hardware models and embedded software simulation. Furthermore, because a separate debugger is often required for each processor core, with the rapid expansion of the number of cores in modern platforms, connecting separate debuggers to each modeled processor is often not feasible.

Additionally, applications running on top of the embedded software may create unexpected errors and require verification and testing. However, application verification and testing is often done separately, and with application specific debuggers, typically requiring execution of a debugger application or debug server for each software application being tested. Furthermore, because these debuggers typically run on the same operating system on which the application is being tested, this can create atypical system conditions and reduce the effectiveness of the test and debug process.

Conventionally, to debug an issue which spans various levels of the hardware and software components of the system, a hardware simulator control interface is used to view and debug the hardware components of the system, a separate software debugger with its own user control interface is connected to each processor model to debug the bare-metal software of interest in the system and one or more debug servers must be run on any embedded OS to connect additional debuggers, each debugger having a control interface.

Using multiple debuggers, and therefore multiple control interfaces, can cause additional difficulties. For example, when a simulation is stopped at one control interface, other control interfaces can be either blocked, or may not have accurate state information if they are unblocked. Additionally, the user must switch between different tools and control languages to see the state of different aspects of a system controlled with multiple different interfaces. Furthermore, command scripting to reproduce debug scenarios is awkward and sometimes impossible, as it can require separate scripts for each control interface.

Additionally, when using multiple control interfaces, elements across multiple hardware states, bare-metal software states, OS process states and/or high level application states cannot be easily specified, retrieved, or identified. Then using these elements as part of a breakpoint condition or action is nearly impossible. Conventionally, a user must manually record needed software or hardware state information as it is available during a simulation and mentally or externally evaluate the condition of the simulation from the information recorded. This may require coordinating multiple breakpoints in different control interfaces. Similarly, in the conventional environment, a user must manually set breakpoints in order to step through the instructions of the modeled components.

Accordingly, there is a need in the art for a system to efficiently debug and analyze components of a virtual platform, including by allowing a user to control and observe the state of the various hardware and software components, including high-level application software, modeled in the virtual platform.

Additionally, there is a need in the art for a system that allows a user to step through the source code of the embedded software at various levels of the software stack as well as the source code representing the hardware models, as the modeled components are executed in the simulation.

Additionally, there is a need in the art for a system that allows a user to manage breakpoints, including by inserting breakpoints that stop the simulation and/or the embedded software running on the processor models and return to a control interface within the simulation to evaluate elements of the hardware and the software states or to perform other breakpoint operations.

BRIEF DESCRIPTION OF THE DRAWINGS

The foregoing and other aspects of various embodiments of the present invention will be apparent through examination of the following detailed description thereof in conjunction with the accompanying drawing figures in which similar reference numbers are used to indicate functionally similar elements.

DETAILED DESCRIPTION

Aspects of the present invention describe a system and method for providing a single integrated simulation interface running in a single host operating system (OS) thread to observe and control multiple, disparate software and hardware components. Aspects of the present invention extend the control mechanisms of a conventional virtual platform to include the hardware models, the embedded software components modeled on the bare-hardware elements or an ISS, and the software applications, processes and threads which are themselves running on embedded software.

Aspects of the present invention provide a system and method for a user of an event-driven simulator to specify complex breakpoint conditions and actions which allow both hardware and software states to be accessed.

Aspects of the present invention describe a system and method for a user of an event-driven simulation environment and/or embedded software debugger interface to step through the source code of components modeled by the environment/debugger, including the embedded software or hardware model source code.

Figure 1:
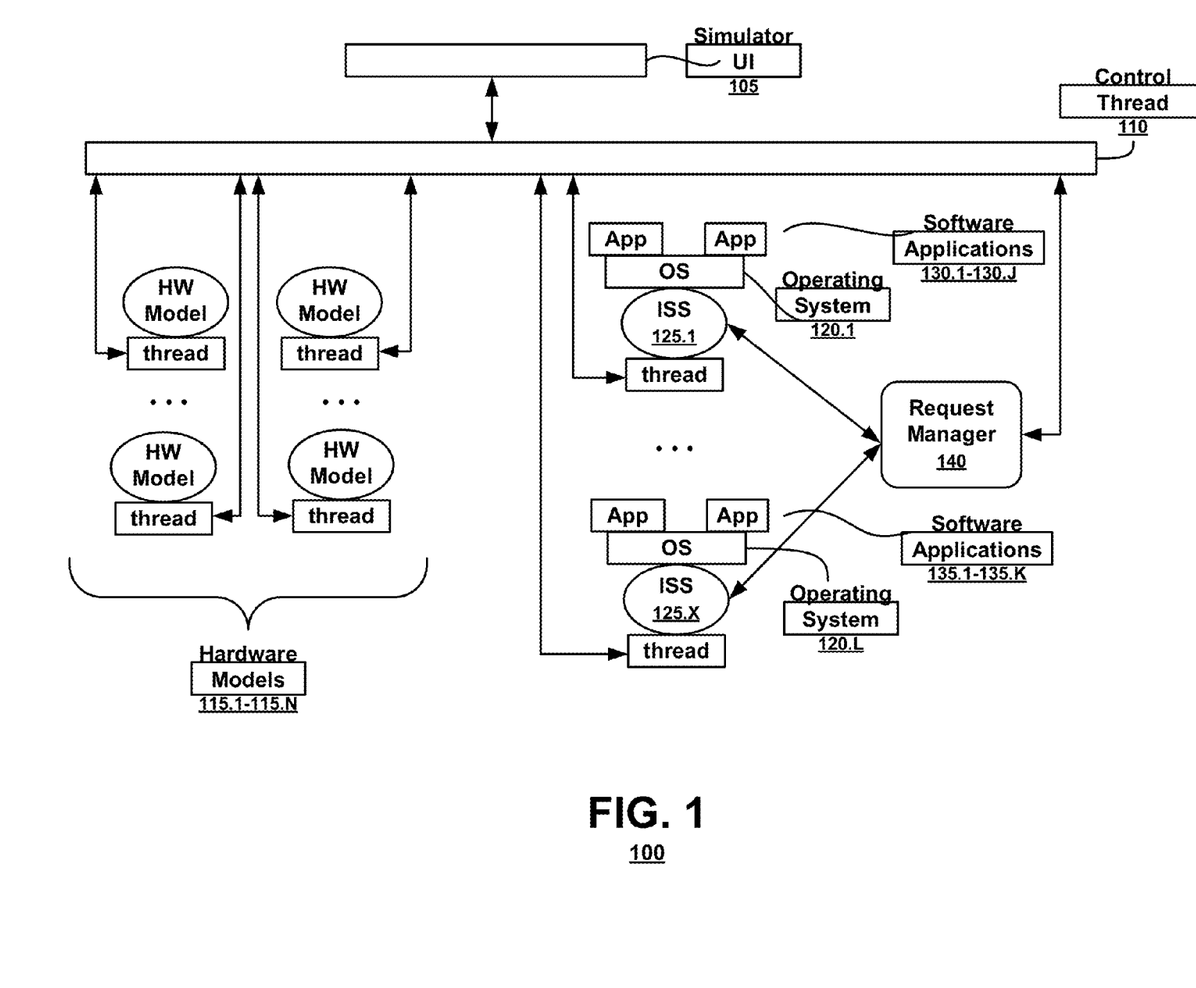
FIG. 1 illustrates an exemplary virtual platform according to an embodiment of the present invention.

FIG. 1 illustrates an exemplary virtual platform (VP) 100 according to an embodiment of the present invention. In FIG. 1, a simulator interface 105 is implemented to provide control and observability for the components of the VP 100. The simulator interface 105 is executed on a control thread 110.

A modeled component as described herein refers to either a hardware component, a bare-metal software program or OS running within the context of a processor hardware component, or a process running on an OS running within the context of a processor hardware component. According to an embodiment of the present invention, the VP 100 may run multiple hardware component models in sequence, with each modeled hardware component using separate host platform resources. Platform resources can include a simulator thread or process, or a call stack that is maintained for each modeled component. A simulator thread as used herein refers to a hardware component modeled within an event-driven simulator which has its own call stack context.

Simulator interface 105 runs in a control thread 110 separate from the modeled components of the virtual platform. State information and other simulation related information for the modeled components is then made available via simulation commands executed by the control thread 110 when control of the simulation returns to the control thread 110.

In FIG. 1, each modeled component is executed on a simulator thread. For example, each hardware model is executed on a simulator thread of the virtual platform. When a modeled component is executed in the course of the event driven simulation, the simulator thread for that model will become active. When a breakpoint or watchpoint in the source code implementing the modeled component is reached, the active simulator thread will yield control to the control thread 110.

The VP 100 may use a processor model ISS 125.1-125.X to access state information for the modeled components via an application programming interface (API). For example, function calls to the API allow the system to display the embedded software view of the memory and the registers of the modeled system. Function calls of the API may also be used to set breakpoints and/or watchpoints which return control from the active simulator thread to the control thread 110. Other APIs may access the state information of the various modeled components. Control mechanisms like stepping, breakpoints and watchpoints are implemented by causing the active simulator thread implementing the modeled component currently being simulated to yield control from the simulator thread associated with the component model back to the control thread 110.

Each of the modeled components of the VP 100 is simulated using individual platform resources as described above. Each of the multiple modeled hardware components 115.1-115.N is executed with individual simulator threads. An OS 120.1-120.L may be simulated with reference to an ISS 125.1-125.X modeling a processor instruction set running on a modeled hardware component. Then, each software application 130.1-130.K and 135.1-135.J or application process running on the OS will be executed as an OS process as necessary. Software applications 130.1-130.K and 135.1-135.J may be any process or application designed to run on the OS. For example, applications 130.1-130.K and 135.1-135.J may include a document editor, a game, a digital camera, an electronics design application, or other high-level application.

The ISS models 125.1-125.X may additionally interface with the control thread 110 via a request manager 140. The request manager 140, as directed by the control thread 110, may read the registers, memory, or other components modeled by the VP 100 via an ISS API to extract state and other information from the simulator.

According to an embodiment of the present invention, the simulator interface 105 in combination with the request manager 140 provides control and observability for all hardware and software components in the VP 100. Representations of the OS data structures and entry points may be used by the simulation interface 105 or request manager 140 to provide improved observability and control over the simulation. For example, a breakpoint of a function in the OS source code that causes a switch between processes can be used to effect the addition of breakpoints or watchpoints specific to the process which is to be started or resumed, while removing breakpoints or watchpoints specific to the OS or to a prior process. Additionally, because the API is used to access memory, registers, or state information, this requires only a function call, not the creation or use of a new process. Consequently, the debugging itself does not utilize a process on the OS that might interfere with the execution of the application.

Figure 2:
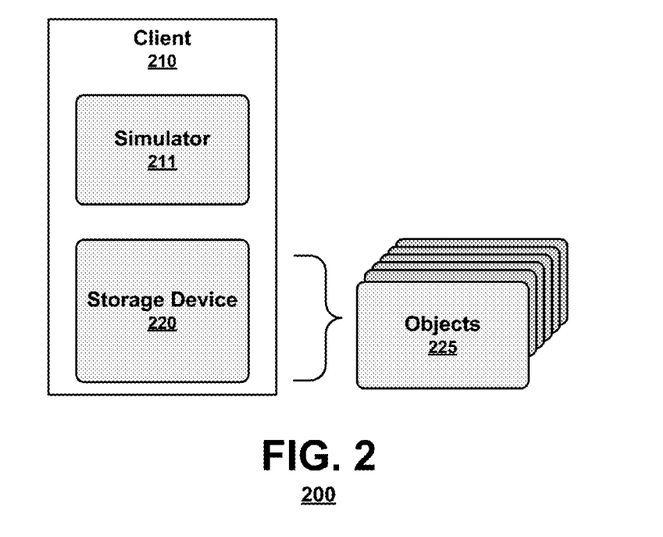
FIG. 2 is a simple block diagram illustrating components of an exemplary system according to an embodiment of the present invention.

A user may access a virtual platform simulator interface in a standalone client system, client-server environment, or a networked environment. FIG. 2 is a simple block diagram illustrating components of an exemplary system 200 according to an embodiment. As shown in FIG. 2, a system 200 may comprise a client 210 executing a simulator 211 and having a memory storage 220. The client 210 may be any computing system that executes a simulator 211 or otherwise facilitates access to memory storage 220, for example a personal computer. The client 210 may include a processor that performs a method in accordance with the disclosed embodiments. Such a client would be part of an overall simulation system in accordance with the disclosed embodiments.

Hardware models, instruction sets, software packages, instances of the modeled components, state information for the modeled components, and other objects 225 used by the simulator 211 may be stored in memory storage 220. A user may access the objects 225 stored in memory storage 220 with the client 210 via the simulator 211, where the simulator 211 is capable of accessing memory storage 220 and displaying the objects 225 and the data associated with the simulation. The simulator 211 may include a user interface, for example a program, application or middleware that acts as a frontend to and facilitates access to objects in memory storage 220. The simulator 211 may facilitate control over and observability into the simulation of the components implemented in a virtual platform using the display and edit tools and procedures described herein. The user may interact with the simulator 211 through a number of input devices, such as by inputting a selection as with a mouse or inputting a request as with a keyboard. The user may observe the simulation results on an output device or display. The simulator 211 may run in an application window controlled by the user.

As shown in FIG. 2, a client 210 may be a stand-alone system, as may be of particular interest where the components being simulated are highly confidential. Additionally, according to an aspect of an embodiment as shown in FIG. 3, a client 310 may be part of a networked environment.

Figure 3:
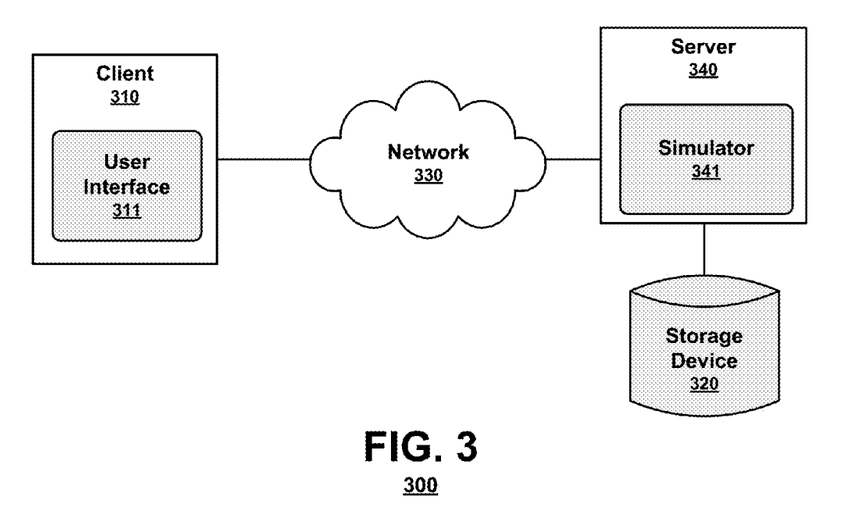
FIG. 3 is a simple block diagram illustrating components of an exemplary system according to an embodiment of the present invention.

FIG. 3 is a simple block diagram illustrating components of an exemplary system 300 according to an embodiment. As shown in FIG. 3, system 300 may include a client 310 having a user interface 311. The client 310 may be connected to a server 340 via a network 330. The simulator 341, which in this embodiment is located at server 340, may have access to storage device 320 storing hardware models, instruction sets, software packages, instances of the modeled components, state information for the modeled components, and other objects utilized by the simulator 341. The server 340 may include a processor that performs a method in accordance with the disclosed embodiments. Such a server then would be part of an overall simulation system in accordance with the disclosed embodiments.

A user may access a simulator 341 at the server 340 via the client 310 having a user interface 311 capable of accessing and displaying the components implemented as part of a virtual platform and the results of the simulation of those components. The client 310 may be any computing system that facilitates the user accessing storage device 320, for example a personal computer. The network 330 may be a wired or wireless network that may include a local area network (LAN), a wireless area network (WAN), the Internet, or any other network available for accessing storage device 320 from the client 310.

The server 340 may be a network server accessible to the client 310 via the network 330 that may manage access to storage device 320. The user interface 311 may receive instructions regarding a simulation from the user and utilizing the objects stored in memory storage 320, facilitate a display of the simulation or the information gathered during the simulation. Multiple different clients (not shown) may access storage device 320 via the network 330 and request access to the objects stored therein.

In another networked environment, the simulator may be executed on a network capable client and access the models, packages and other objects stored in one or more storage devices via a network and communications server.

Figure 4:
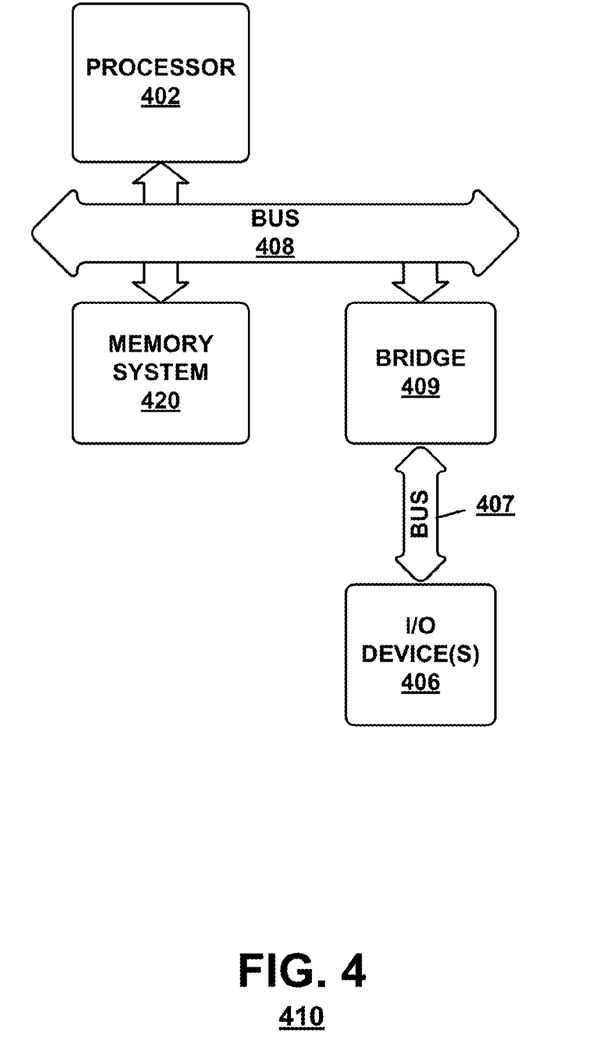
FIG. 4 is a simple block diagram illustrating components of an exemplary client according to an embodiment of the present invention.

FIG. 4 is a simple block diagram illustrating components of an exemplary client 410 according to an embodiment of the present invention. As shown in FIG. 4, the client 410 configured to execute the simulator as described herein may include a processor 402, a memory system 420 and one or more input/output (I/O) devices 406 in communication. The communication can be implemented in a variety of ways and may include one or more computer buses 407, 408 and/or bridge devices 409 as shown in FIG. 4. The I/O devices 406 can include network adapters and/or mass storage devices from which the client 410 can receive commands for executing the simulation.

As shown in FIG. 2, a client 410 may be a stand-alone system, as may be of particular interest where the components being simulated are highly confidential. Additionally, according to an aspect of an embodiment as shown in FIG. 3, a client 410 may be part of a networked environment.

Figure 5:
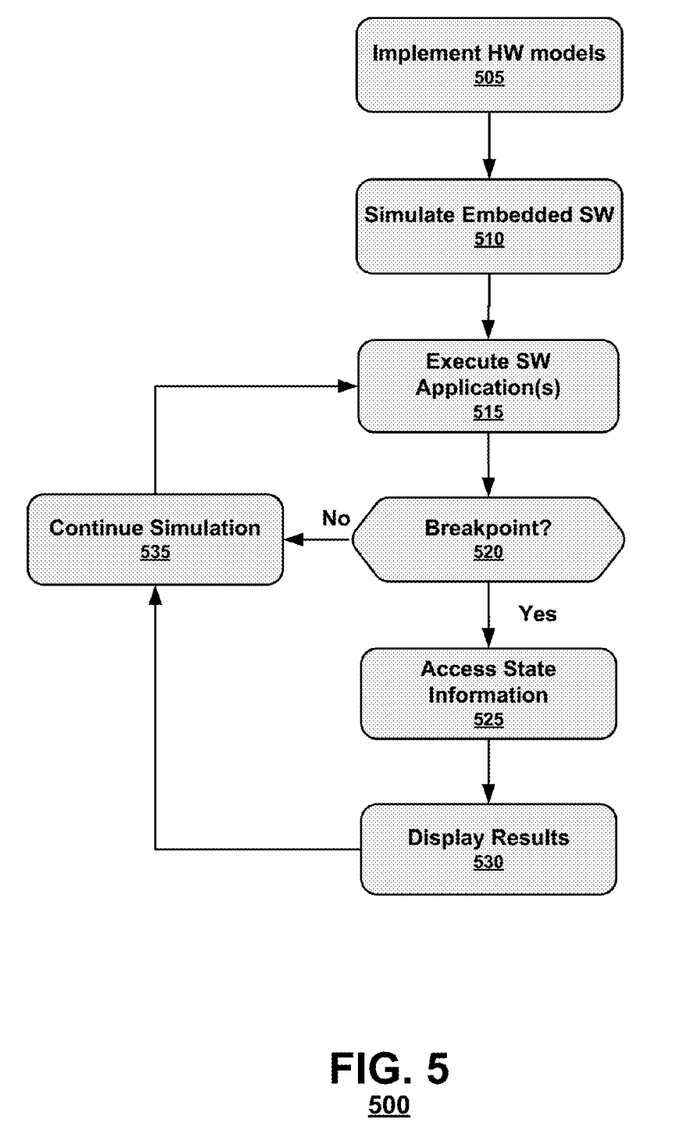
FIG. 5 illustrates an exemplary method for simulating hardware and software components implemented on a virtual platform according to an embodiment of the present invention.

FIG. 5 illustrates an exemplary method 500 for simulating hardware and software components implemented on a virtual platform according to an embodiment of the present invention. As shown in FIG. 5, to simulate a unified virtual platform executing hardware models, embedded software simulators, and software applications running on the embedded software, one or more hardware models may be implemented (block 505). Additionally, one or more embedded software applications may be simulated, for example by using an instruction set simulator in conjunction with a hardware model (block 510). Then one or more high-level software applications may be executed with the simulated embedded software (block 515). The simulation may step sequentially through the execution of each high-level software application, embedded software application, and hardware model as necessary to run the high-level application, thereby simulating an event-driven system.

During execution, if the source code for any component reaches a breakpoint, a watchpoint, or other stop point (e.g. an error) (block 520), control of the simulation will transfer to a control thread. The control thread will then allow a controller or event manager of the system to access state information of one or more modeled components or other information, or otherwise execute an additional command as part of the simulation and verification process (block 525). The information or other simulation results may then be displayed in a simulation interface (block 530). Once the conditions of the breakpoint have been handled, the simulation may return to the simulator thread that was executing when the breakpoint was reached or otherwise continue the simulation by sequentially stepping through the application procedures (block 535).

According to an embodiment of the present invention, in order to insert or create complex breakpoint conditions within the virtual platform, identifiers are constructed which unambiguously designate a particular state or element associated with a particular instance of a modeled hardware component or a particular instance, element or object of a modeled software component in the context of the entire simulation. Implementing global identifiers for each instance of a modeled element allows such identifiers to appear in condition expressions and action statements in the simulator interface or request manager and defines mechanisms for the simulator interface to query or set hardware or software states as appropriate. Hardware and software breakpoints yield control from the active simulator threads associated with individual models back to the control thread, potentially subject to conditions or implying additional actions. Software breakpoints similarly yield control from the executing embedded software to the control thread.

According to an aspect of an embodiment, an identifier for a hardware object is constructed using an unambiguous hierarchical path name that references the associated modeled component in the system. The hierarchical path name may use a path name separator (for example ".") to distinguish each element within the domain. For example, a register named "R1" in a direct memory access (DMA) controller instance named "DMA" which is part of a processor subsystem instance named "proc" which is itself part of a larger electronics system instance being simulated named "phone" might be named "phone.proc.DMA.R1".

Figure 7A:
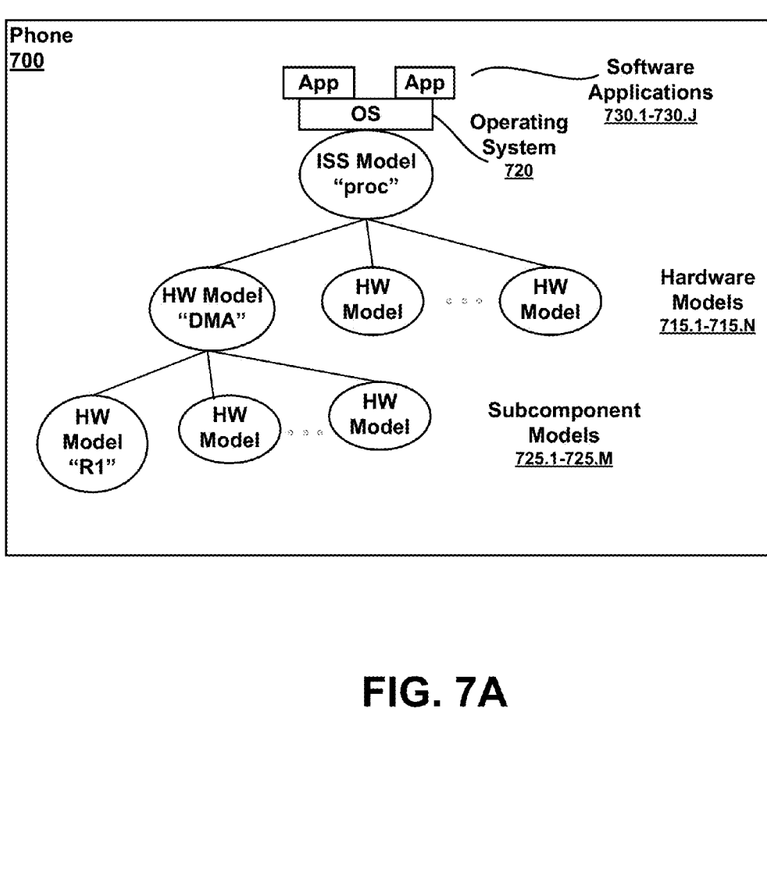
FIGS. 7A-7C illustrate exemplary systems having components modeled with a virtual platform, the components unambiguously identified according to an embodiment of the present invention.

FIG. 7A illustrates an exemplary system for which this unique identifier would apply. In FIG. 7A, a virtual platform is used to model components of a phone 700. As shown, the phone model includes a processor model named "proc" running an OS 720 with one or more software applications 730.1-730.J running on the OS 720. The modeled phone 700 also includes multiple hardware models 715.1-715.N, one of which is a direct memory access controller named "DMA". The DMA model has multiple modeled subcomponents 725.1-725.M, including a register named "R1". Then to reference the R1 register of the DMA model, the unambiguous identifier would be "phone.proc.DMA.R1".

Similarly, an unambiguous identifier for a software object is also constructed within the context of a particular software program using a unique hierarchical name. For example, a variable "i" declared within a function "start_kernel"

declared in a program called "Linux" would have the hierarchical name "Linux:start_kernel.i".

Figure 7B:
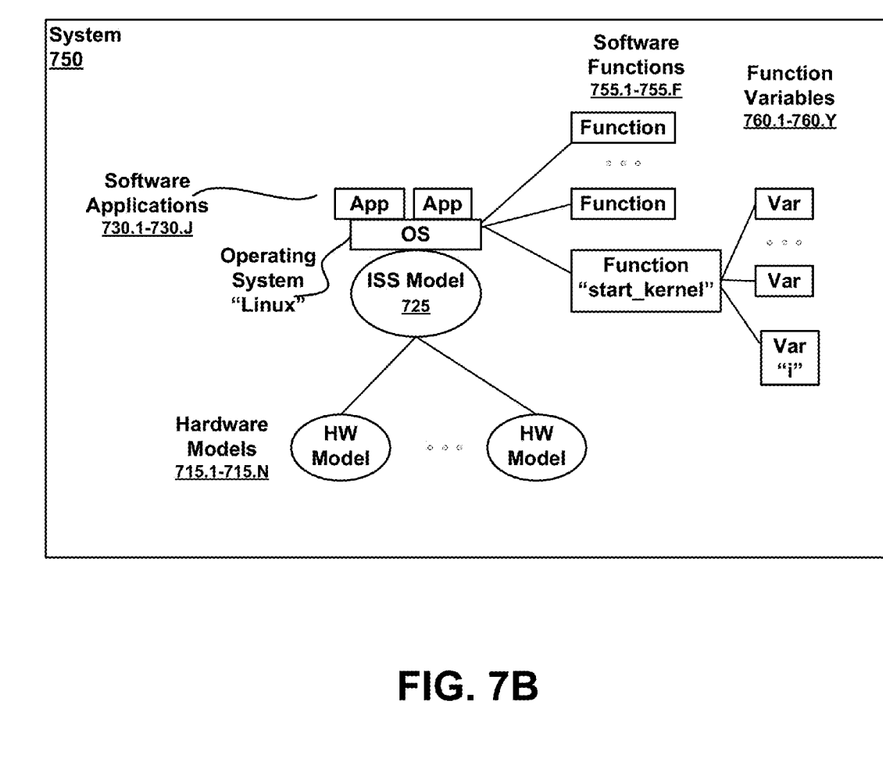

FIG. 7B illustrates an exemplary system for which this unique identifier would apply. In FIG. 7B, a virtual platform is used to model a system 750. As shown, the modeled system 750 includes a processor model 725 having multiple hardware models 715.1-715.N. An OS named "Linux" runs on the modeled processor 725 and executes one or more software applications 730.1-730.J that. The OS also initiates multiple functions 755.1-755.F, one of which is the function named "start_kernel" having multiple variables 760.1-760.Y. One variable of the function is variable "i". Then to reference the variable "i" of the "start_kernel function", the unambiguous identifier would be "Linux:start_kernel.i".

The hierarchical path names within either the hardware or software domains can then be hierarchically combined to form an unambiguous identifier for each hardware or software state element in the entire system. An identifier may use a hierarchical separator (for example ":") between each software and hardware domain to construct the unambiguous identifier, where the path name separator and the domain name separator are distinct. For example, to reference a variable "i" within a function "main" within a program "app" running under an OS "Linux" which is running on a processor called "phone.proc", the identifier "phone.proc:Linux:app:main.i" unambiguously refers to that software element.

Figure 7C:
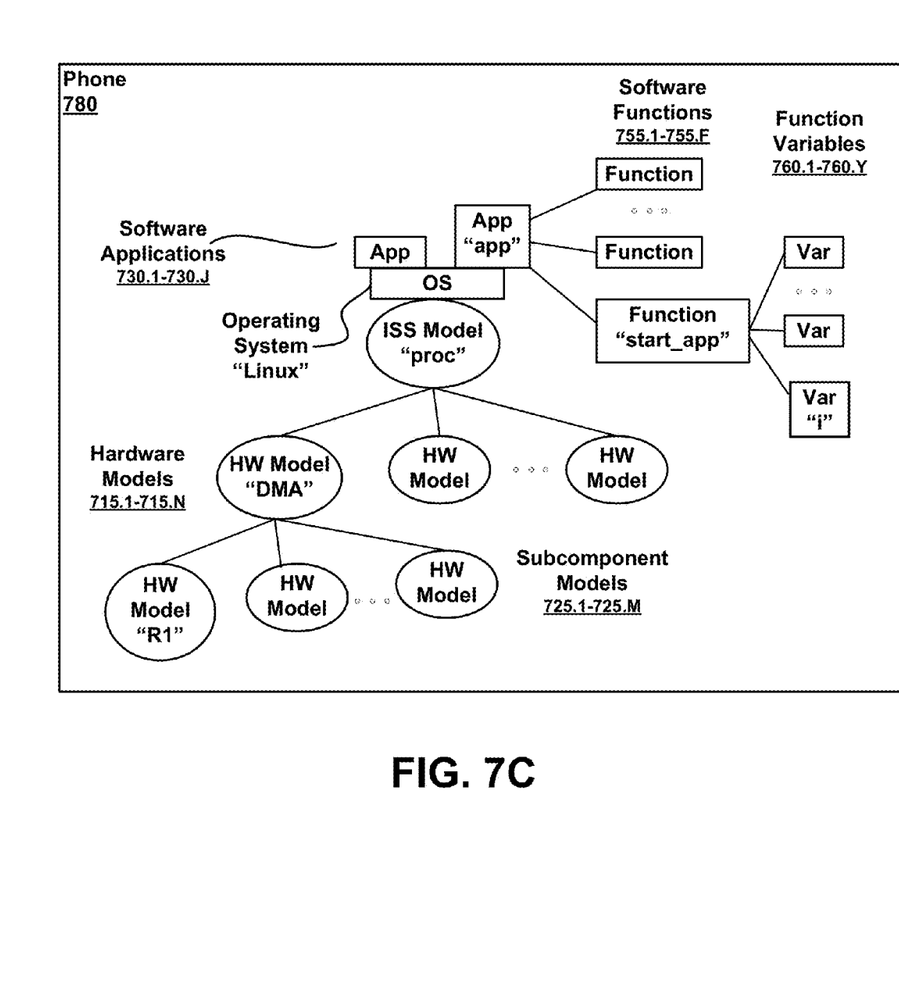

FIG. 7C illustrates an exemplary system for which this unique identifier would apply. In FIG. 7C, a virtual platform is used to model components of a phone 780. As shown, the phone model 780 includes a processor model named "proc" having an OS named "Linux" running on the modeled processor and one or more software applications 730.1-730.J running on the OS. As shown, one of the software applications named "app" has multiple functions 755.1-755.F, one of which is the function named "start_app" having multiple variables 760.1-760.Y. One variable of the function is variable "i". Then to reference the variable "i" of the "start_app function", the unambiguous identifier would be "phone.proc:Linux:app:start_app.i".

The modeled phone 780 also includes multiple hardware models 715.1-715.N, one of which is a direct memory access controller named "DMA". The DMA model has multiple modeled subcomponents 725.1-725.M, including a register named "R1". Again, to reference the "R1" register of the DMA model, the unambiguous identifier would be "phone.proc.DMA.R1".

Referring back to FIG. 1, a controller of virtual platform 100, for example the simulator interface 105 or the request manager 140 can use the described identifiers to access or set state information of the identified elements. For example, the simulator interface 105 can define the unambiguous identifier syntax described above in its command language and then use the API previously described to collect information about the identified element or set states for the identified elements via function calls within the same host process and address space.

Although described primarily with reference to a unified simulation system, the unambiguous naming scheme may be implemented in other simulation environments. For example, if used with a conventional simulator having a different debugger or debug server and a unique interface for each application being simulated in the environment, an unambiguous identifier can be constructed by separately modifying each control user interface for each debugger to allow the use of the unambiguous identifier syntax described above. Then the hardware and software components of the system can share state information through a shared memory, writing to disk storage, or an alternate mechanism, and actions can be directed to the appropriate control interfaces to be executed when that interface regains control.

The ability to unambiguously identify elements of the virtual platform allows the system to automatically monitor and track the states of the elements and the actions of the modeled components. This will reduce mistakes and make the simulation and debugging processes more efficient.

According to an embodiment of the present invention, to facilitate stepping through the source code of the modeled components implemented in a virtual platform, the system may insert breakpoints at certain common actions. For a simulator running multiple hardware models in sequence with each model having a separate simulator execution thread, hardware stepping yields control from the simulator threads associated with individual models back to the control thread after a predetermined number of source lines of the model have been executed. Similarly, software stepping yields execution control from the embedded software to the control thread after a predetermined amount of software source code has been executed. Aspects of the present invention allow a stepping operation to cross the software and hardware domains so that either the next software or hardware source code line, as appropriate, will be executed in sequence before returning to the control thread.

To step between domains in the virtual platform, breakpoints at known domain context switches may be added. For example, a processor model will generally execute a minimum portion of instructions representing lines of source code for an embedded software application at a time. Setting a hardware breakpoint at the point that the portion of instructions starts or expires allows stepping between the software domain to the hardware domain. Similarly, setting breakpoints in the OS routines that manage the context switches between processes/threads running on the OS allows the stepping between the embedded software and the applications and processes running on the OS.

For example, referring to FIG. 1, the simulator interface 105, request manager 140, or other controller can traverse the source code for the modeled components of the virtual platform and set appropriate breakpoints at the identifiable context switches and then use an API to implement stepping support by using function calls within the same host process and address space. Then, the breakpoints may be used to monitor the states of the modeled components or may provide the opportunity to change a state of hardware and/or software at that breakpoint, or upon resuming execution of the simulation.

Figure 6:
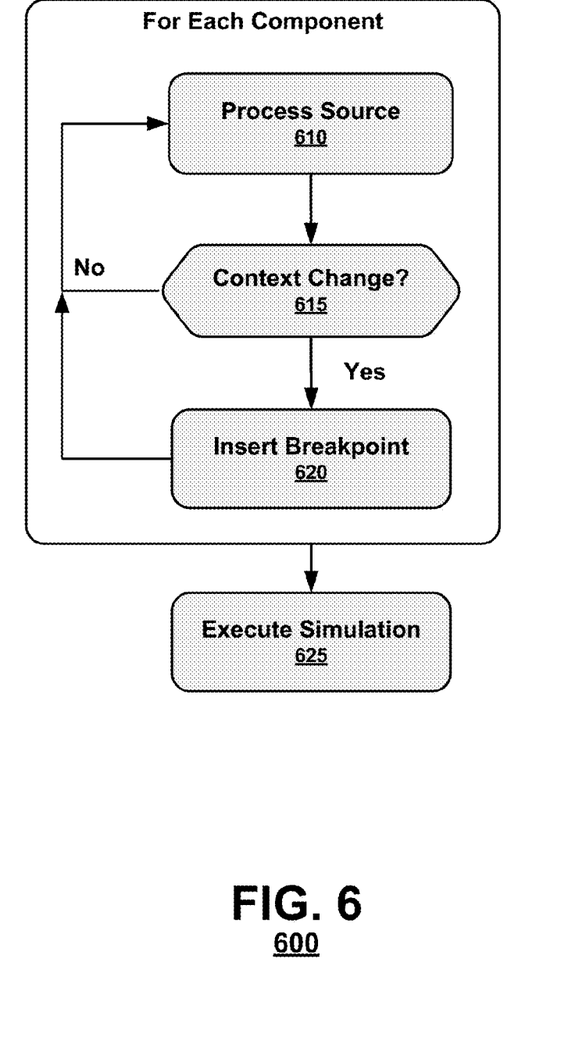
FIG. 6 illustrates an exemplary method for inserting breakpoints to facilitate stepping through the components of a virtual platform according to an embodiment of the present invention.

FIG. 6 illustrates an exemplary method for inserting breakpoints to facilitate stepping through the modeled components of a virtual platform. As shown in FIG. 6, for each component, the simulator traverses the source code (block 610). The simulator can then detect and identify context changes in the source code, for example when a new process is called or a process is completed (block 615). Upon detection of an appropriate context change or other insertion point, a breakpoint will be inserted (block 620). Once the simulator has completed the traversal of the appropriate source code, the simulation of the modeled components can be executed (block 625). During execution, when an active process encounters a breakpoint, the active simulator thread will yield to the control thread to check for predefined actions or user input to utilize the breakpoint.

Although described primarily with reference to breakpoints, the simulator can also traverse the source code for proper watchpoints, for example by detecting when a particular variable is written, read, or changed.

Although described primarily with reference to a unified simulation system, the insertion of breakpoints may be utilized in other simulation environments. For example, if used with a conventional simulator having a different debugger or debug server and a unique interface for each application being simulated in the environment, context switches may be detected by directing each individual control interface to traverse the associated source code and set appropriate breakpoints as described above. Control of the source stepping operation then progresses from one control interface to the next as each control interface successively gains control of the simulation.

The ability to insert appropriate breakpoints in the software of the modeled components allows the system to automatically identify proper breakpoints in the source code of the modeled components. Additionally, the system may identify breakpoints that are not obvious or not accessible to a user manually inserting breakpoints. This will reduce mistakes and make the simulation and debugging processes more efficient.

In some applications, the modules described hereinabove may be provided as elements of an integrated software system, in which the blocks may be provided as separate elements of a computer program. Some embodiments may be implemented, for example, using a non-transitory computer-readable storage medium or article which may store an instruction or a set of instructions that, if executed by a processor, may cause the processor to perform a method in accordance with the embodiments. Other applications of the present invention may be embodied as a hybrid system of dedicated hardware and software components. Moreover, not all of the modules described herein need be provided or need be provided as separate units. Additionally, the arrangement of the blocks in FIGS. 5 and 6 do not necessarily imply a particular order or sequence of events, nor are they intended to exclude other possibilities. For example, the operations depicted at blocks 505, 510, and 515 may occur in any order or substantially simultaneously with each other. Such implementation details are immaterial to the operation of the present invention unless otherwise noted above.

The exemplary methods and computer program instructions may be embodied on a non-transitory computer readable storage medium that may include any medium that can store information. Examples of a computer readable storage medium include electronic circuits, semiconductor memory devices, ROM, flash memory, erasable ROM (EROM), floppy diskette, CD-ROM, optical disk, hard disk, fiber optic medium, or any electromagnetic or optical storage device. In addition, a server or database server may include computer readable media configured to store executable program instructions. The features of the embodiments of the present invention may be implemented in hardware, software, firmware, or a combination thereof and utilized in systems, subsystems, components or subcomponents thereof.

While the invention has been described in detail above with reference to some embodiments, variations within the scope and spirit of the invention will be apparent to those of ordinary skill in the art. Thus, the invention should be considered as limited only by the scope of the appended claims.

What is claimed is:

1. A method for simulating modeled components in a virtual platform with global identifiers, the method comprising:
on a computer device having a single interface, running on a single control thread, to access all modeled components, including at least one modeled hardware component and at least one modeled software component, in the virtual platform:
implementing a hardware model simulating a processor in the virtual platform; simulating an operating system (OS) operating in conjunction with the hardware model; executing an application on the OS; and simulating the modeled components using an event-driven simulator; upon detecting a breakpoint in source code of the application for a modeled component of the modeled components during the simulation, transferring control of the simulation to the control thread, wherein the control thread accesses state information for the modeled component by utilizing a global identifier to retrieve the state information from a memory, wherein the breakpoint occurs at least at a domain context switch in the source code, and wherein the domain context switches occur when the source code being processed switches from being: (i) the source code of the modeled hardware component to the source code of the modeled software component or (ii) the source code of the modeled software component to the source code of the modeled hardware component.

2. The method of claim 1, wherein accessing the state information for the modeled component includes reading the state information stored in memory for the modeled component.

3. The method of claim 1, further comprising setting the state information stored in the memory for the modeled component.

4. The method of claim 1, wherein the processor is implemented using an instruction set simulator (ISS).

5. The method of claim 4, wherein the state information for the modeled component is accessed with an application programming interface (API) for the ISS.

6. The method of claim 1, further comprising displaying the state information on a display of the computer device.

7. The method of claim 1, wherein the global identifier includes an instance name of the modeled component.

8. The method of claim 1, wherein the global identifier includes a hierarchical path name that references the modeled component.

9. The method of claim 1, wherein for the modeled hardware component, each subcomponent has a unique global identifier.

10. The method of claim 1, wherein for the modeled software component, each software object has a unique global identifier.

11. A system comprising:
a memory to store a plurality of component models and state information associated with each modeled component for a virtual platform; and
a hardware processor configured to simulate the modeled components including at least one modeled hardware component and at least one modeled software component, wherein each of the modeled components is accessible from a single interface, running on a single control thread, in the virtual platform, by:
implementing a hardware model simulating a processor in the virtual platform; simulating an operating system (OS) operating in conjunction with the hardware model;
executing an application on the OS;
simulating the modeled components using an event-driven simulator; and
upon detecting a breakpoint in source code of the application for a modeled component of the modeled components during the simulation, transferring control of the simulation to the control thread, wherein the control thread accesses state information for the modeled component by utilizing a global identifier to retrieve the state information from a memory wherein the breakpoint occurs at least at a domain context switch in the source code, and wherein the domain context switches occur when the source code being processed switches from being: (i) the source code of the hardware modeled component to the source code of the software modeled component or (ii) the source code of the software modeled component to the source code of the hardware modeled component.

12. The system of claim 11, wherein accessing state information for the modeled component includes reading the state information stored in the memory for the modeled component.

13. The system of claim 11, wherein the hardware processor is configured to set state information stored in the memory for the modeled component.

14. The system of claim 11, wherein the simulated processor is implemented using an instruction set simulator (ISS).

15. The system of claim 14, wherein the state information for the modeled component is accessed with an application programming interface (API) for the ISS.

16. The system of claim 11, further comprising a display to display the state information.

17. The system of claim 11, wherein the global identifier includes an instance name of the modeled component.

18. The system of claim 11, wherein the global identifier includes a hierarchical path name that references the modeled component.

19. The system of claim 11, wherein for the modeled hardware component, each subcomponent has a unique global identifier.

20. The system of claim 11, wherein for the modeled software component, each software object has a unique global identifier.

* * * * *